(12) United States Patent
Nakamura

(10) Patent No.: US 9,502,685 B2
(45) Date of Patent: Nov. 22, 2016

(54) ORGANIC EL ELEMENT INCLUDING EL LAYER AND INSULATING LAYER BETWEEN ELECTRODES

(71) Applicant: Panasonic Corporation, Osaka (JP)

(72) Inventor: Masahiro Nakamura, Osaka (JP)

(73) Assignee: Panasonic Corporation, Osaka (JP)

(*) Notice: Subject to any disclaimer, the term of this patent is extended or adjusted under 35 U.S.C. 154(b) by 0 days.

(21) Appl. No.: 14/741,453

(22) Filed: Jun. 17, 2015

(65) Prior Publication Data
US 2015/0380674 A1 Dec. 31, 2015

(30) Foreign Application Priority Data
Jun. 25, 2014 (JP) ................. 2014-130369

(51) Int. Cl.
*H01L 29/08* (2006.01)
*H01L 51/52* (2006.01)

(52) U.S. Cl.
CPC ....... *H01L 51/5253* (2013.01); *H01L 51/5203* (2013.01); *H01L 51/5246* (2013.01); *H01L 51/5228* (2013.01); *H01L 51/5275* (2013.01); *H01L 2251/5392* (2013.01); *H01L 2251/558* (2013.01)

(58) Field of Classification Search
CPC .................................... H01L 51/52
USPC ............. 257/40; 313/52, 503, 504, 506, 512
See application file for complete search history.

(56) References Cited

U.S. PATENT DOCUMENTS

| | | | |
|---|---|---|---|
| 8,519,425 B2* | 8/2013 | Yada ....................... | H05B 33/10 257/13 |
| 2005/0093432 A1* | 5/2005 | Yamazaki ........... | H01L 51/5215 313/503 |
| 2005/0200273 A1 | 9/2005 | Nozawa | |
| 2007/0071885 A1* | 3/2007 | Kumagai ............ | H01L 27/3246 427/66 |
| 2007/0222370 A1 | 9/2007 | Zhu et al. | |
| 2007/0241664 A1* | 10/2007 | Sakamoto ........... | H01L 27/3276 313/503 |
| 2008/0079360 A1 | 4/2008 | Kubota | |
| 2008/0290789 A1* | 11/2008 | Kai ...................... | H01L 27/3246 313/504 |
| 2012/0007134 A1 | 1/2012 | Miyai et al. | |
| 2012/0049175 A1* | 3/2012 | Ono ..................... | H01L 27/3246 257/40 |
| 2012/0138973 A1* | 6/2012 | Matsushima ....... | H01L 27/3211 257/88 |
| 2013/0126853 A1 | 5/2013 | Nakamura et al. | |
| 2015/0102333 A1* | 4/2015 | Miyamoto .......... | H01L 33/0041 257/40 |

FOREIGN PATENT DOCUMENTS

| | | |
|---|---|---|
| JP | 2005-128310 | 5/2005 |
| JP | 2005-285743 | 10/2005 |

(Continued)

*Primary Examiner* — Caleb Henry
(74) *Attorney, Agent, or Firm* — Renner, Otto, Boisselle & Sklar, LLP

(57) ABSTRACT

An organic EL element including: first and second electrode layers; an organic EL layer located therebetween and including a light-emitting layer; an insulating layer extending between the electrode layers at least in a region where the organic EL layer is not present; and a sealing layer located on the other side of the second electrode layer from the organic EL layer, the sealing layer covering at least the organic EL layer. The insulating layer includes first and second sections provided between the electrode layers. The second section is thicker than the first section and not closer to the organic EL layer. At least a part of the second section is not covered by the sealing layer. The first section is entirely covered by the sealing layer. The insulating layer located between the electrode layers and not covered by the sealing layer is entirely included in the second section.

20 Claims, 8 Drawing Sheets

(56) References Cited

FOREIGN PATENT DOCUMENTS

| JP | 2007-536697 | 12/2007 |
| JP | 2008-311239 | 12/2008 |
| JP | 2010-198980 | 9/2010 |
| JP | 2012-174558 | 9/2012 |

* cited by examiner

ORGANIC EL ELEMENT INCLUDING EL LAYER AND INSULATING LAYER BETWEEN ELECTRODES

BACKGROUND

1. Technical Field

The present disclosure relates to an organic electroluminescence element (hereinafter abbreviated to "organic EL element"), which is an electric light-emitting element.

2. Description of the Related Art

An organic EL element has a multilayer body including an anode, a cathode, and an organic layer located therebetween and having a light-emitting layer. In general, the multilayer body is provided on a substrate, such as a glass board, and covered with a sealant. Outside the region covered with the sealant, there are anode lead-out and cathode lead-out sections electrically coupled to the anode and the cathode, respectively. Through these lead-out sections, voltage provided from an external power supply is applied between the electrodes. The organic EL element is driven using the phenomenon called electroluminescence, which occurs through the recombination of a hole and an electron injected from the anode and the cathode, respectively, into the organic layer upon the application of voltage between the electrodes.

In recent years, the use of a substrate having an electroconductive surface for organic EL elements has been proposed. Examples of substrates having an electroconductive surface include metallic foils, plastic films coated with a metallic film or any other electroconductive film, and glass boards coated with an electroconductive film. In particular, the use of a flexible substrate, such as a metallic foil or a plastic film coated with a metallic film, provides an organic EL element that is flexible and can be rolled and bent (hereinafter referred to as a "flexible organic EL element"). A flexible organic EL element can be produced using, for example, roll-to-roll processing.

The structure of an organic EL element having a substrate with an electroconductive surface is disclosed in, for example, Japanese Unexamined Patent Application Publication No. 2012-174558. In the organic EL element disclosed in this publication, the electroconductive surface of the substrate is used as the cathode and the cathode lead-out section.

FIG. 8 is a cross-sectional diagram illustrating the organic EL device disclosed in this publication. The organic EL device has a first substrate 2 capable of serving as a cathode layer, an organic layer 3 on the first substrate 2, an anode layer 4 (41 and 42) on the organic layer 3, and a second substrate 6 bonded to the anode layer 4 via an adhesive layer 5. The first substrate 2 and the anode layer 4 extend to the outside of the region where the organic layer 3 is present, and part of the extended portions of the first substrate 2 and the anode layer 4 expose from under the second substrate 6 to form a cathode lead-out section 40b and an anode lead-out section 40a, respectively. An insulating layer 7 insulates between the extended portions of the first substrate 2 and the anode layer 4.

SUMMARY

As mentioned above, a known organic EL element may have an insulating layer in a region other than the light-emitting region. The insulating layer suppresses a short circuit between the electrodes. An enhanced reliability of an organic EL element like this is demanded.

One non-limiting and exemplary embodiment provides an organic EL element that can be highly reliable.

In one general aspect, the techniques disclosed here feature an organic EL element. The organic EL element includes: a first electrode layer; a second electrode layer; an organic EL layer located between the first electrode layer and the second electrode layer, the organic EL layer including a light-emitting layer; an insulating layer extending, in a plan view, between the first electrode layer and the second electrode layer at least in a region where the organic EL layer is not present; and a sealing layer located on the other side of the second electrode layer from the organic EL layer, the sealing layer covering, in the plan view, at least the organic EL layer, wherein: the insulating layer includes a first section and a second section provided, in the plan view, between the first electrode layer and the second electrode layer, the second section being thicker than the first section in a cross sectional view, the first section being closer to the organic EL layer than the second section is; and in the plan view, at least a part of the second section is not covered by the sealing layer, an entire portion of the first section being covered by the sealing layer, an entire portion of the insulating layer located between the first electrode layer and the second electrode layer and not covered, in the plan view, by the sealing layer is included in the second section.

It should be noted that general or specific embodiments may be implemented as an element, a device, a system, an integrated circuit, a method, or any selective combination thereof.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

DETAILED DESCRIPTION

Figure 1A:
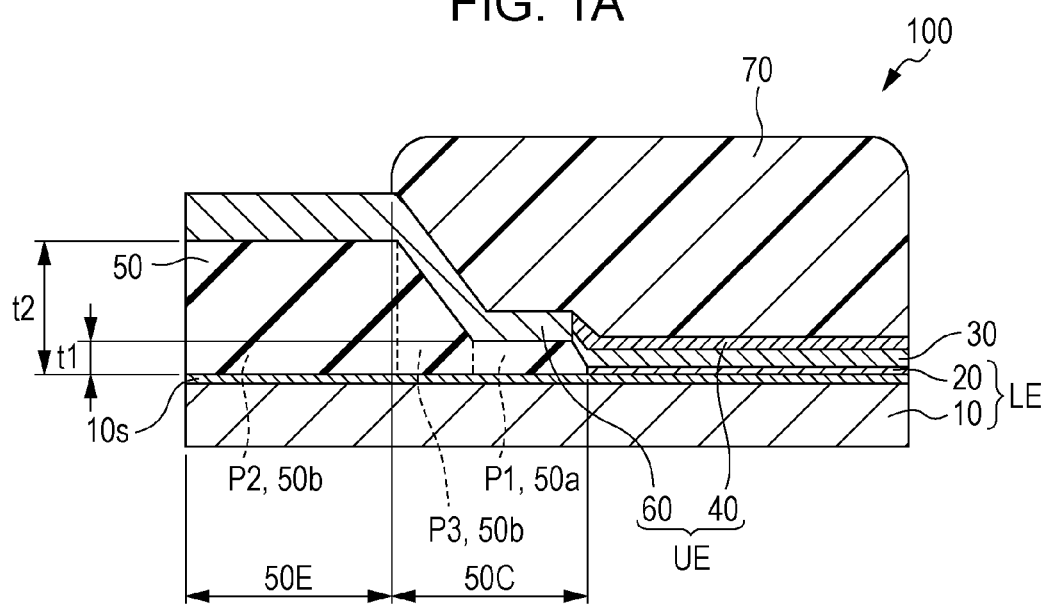
FIG. 1A is a cross-sectional view of an organic EL element according to an embodiment.

The underlying knowledge forming the basis of the present disclosure is as follows.

As mentioned above, an organic EL element has a multilayer body including a pair of electrodes and an organic EL layer located therebetween. In general, the multilayer body is sealed with a sealant from the outside. The pair of electrodes of the organic EL element is supplied with current from a power supply provided outside the element (an external power supply). For this purpose, the electrodes of the organic EL element have a lead-out section extending out from under the sealant, and these lead-out sections connect to the external power supply.

For example, when an organic EL element includes a substrate having an electroconductive surface, the electrode on the substrate side ("the lower electrode") is electrically coupled to the external power supply via the electroconductive surface of the substrate. The other electrode ("the upper electrode") is electrically coupled to the external power supply via, for example, a lead-out electrode extending out from under the sealant. To prevent a short circuit between the lead-out electrode and the electroconductive surface of the substrate, an insulating layer therebetween provides electrical insulation. The insulating layer is located in, for example, a region other than the light-emitting region when viewed from the direction normal to the substrate.

Through research, the inventor of the present disclosure found that the process for producing this type of known organic EL element can be complicated because the insulating layer needs to be formed in a specific position between the electrodes.

Through further studies, the inventor of the present disclosure also identified the following problems. In general, when silver, copper, or any other metallic material such as lead, tin, or zinc is used as an electrode or similar in an electronic component, ion migration should be more likely if the electrode is exposed to the air than if it is covered with a sealant.

In an organic EL element disclosed in publications such as Japanese Unexamined Patent Application Publication No. 2012-174558, part of the electroconductive surface of the substrate and part of the lead-out electrode are exposed to the air. If the lead-out electrodes are made of a metallic material such as silver or copper, ion migration can cause poor insulation between the electrodes. The ion migration occurs in the air-exposed portion of the lead-out electrodes A substrate having a metallic layer as an electroconductive surface can also cause poor insulation.

Furthermore, there can be a case where the substrate has no electroconductive surface. Even in this case, when viewed from the direction normal to the substrate, the electrode layer including the upper electrode and its lead-out electrode may at least partially overlap with the electrode layer including the lower electrode and its lead-out electrode in a region other than the light-emitting region. In such a case, an insulating layer may be provided between the two electrode layers. This structure can also lead to a problem similar to the above.

The inventor of the present disclosure, however, found that the insulating layer having multiple sections with different thicknesses can allow the organic EL element to be easily produced. Furthermore, the inventor found that the insulating layer having multiple sections with different thicknesses can prevent poor insulation induced by ion migration, thereby enhancing the reliability of the organic EL element.

Embodiment 1

The following describes Embodiment 1 of an organic EL element.

Figure 1B:
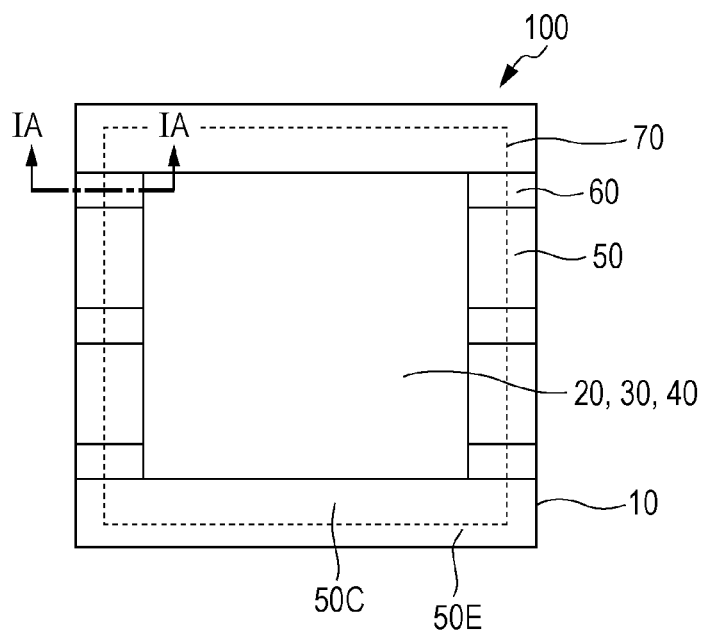
FIG. 1B is a plan view of the organic EL element according to an embodiment.

FIG. 1A is a cross-sectional diagram illustrating part of an organic EL element 100, and FIG. 1B is a plan view of the organic EL element 100. FIG. 1A illustrates a cross-sectional structure along line IA-IA in FIG. 1B.

The organic EL element 100 has a first electrode layer LE, a second electrode layer UE, an organic EL layer 30 including a light-emitting layer, an insulating layer 50, and a sealing layer 70. The organic EL layer 30 is located between the first electrode layer LE and the second electrode layer UE.

The insulating layer 50 extends at least in a region between the first electrode layer LE and the second electrode layer UE where the organic EL layer 30 is not present. In the illustrated structure, the insulating layer 50 is located, for example, around the organic EL layer 30 when viewed from the direction normal to the first electrode layer LE. The end of the insulating layer 50 on the organic EL layer 30 side may be in contact with the organic EL layer 30. The end of the insulating layer 50 on the organic EL layer 30 side may be covered with the organic EL layer 30 as in the structure illustrated in FIG. 1A.

The sealing layer 70 extends on part of the second electrode layer UE. The sealing layer 70 covers the organic EL layer 30 and part of the insulating layer 50 when viewed from the direction normal to the first electrode layer LE. In the illustrated structure, the sealing layer 70 extends from above the organic EL layer 30 to above the nearby insulating layer 50. Part of the insulating layer 50 is exposed from under the sealing layer 70.

As illustrated in FIG. 1A, between the first electrode layer LE and the second electrode layer UE, the insulating layer 50 has a first section 50a and a second section 50b thicker than the first section 50a. The first section 50a is closer to the organic EL layer 30 than the second section 50b is. The entire portion 50E of the insulating layer 50 exposed from under the sealing layer 70 between the first electrode layer LE and the second electrode layer UE (hereinafter abbreviated to "the exposed portion") is the second section 50b. The first section 50a of the insulating layer 50 herein represents a section including the end of the insulating layer 50 on the organic EL layer 30 side. The second section 50b represents a section entirely thicker than the first section 50a and closer to the periphery of the element than the first section 50a is.

In the illustrated structure, the insulating layer 50 has a first flat portion P1 (a thickness of t1), a second flat portion P2 (a thickness of t2; t2>t1), and a sloping portion P3 (a thickness changes from t1 to t2) located between the first flat portion P1 and the second flat portion P2. The first flat portion P1 is a relatively flat portion located near the organic EL layer 30. The second flat portion P2 is a relatively flat portion located closer to the periphery of the element. In this case, the first section 50a of the insulating layer 50 is the first flat portion P1, and the second section 50b includes the second flat portion P2 and the sloping portion P3. The sealing layer 70 covers the first flat portion P1 and the sloping portion P3, but does not cover the second flat portion P2 as part of the second section 50b. The end of the sealing layer 70 is located on the sloping portion P3. The thickness of the exposed portion 50E of the insulating layer 50 is t2. The entire exposed portion 50E is therefore thicker than the portion 50C of the insulating layer 50 covered with the sealing layer 70 (hereinafter abbreviated to "the covered portion"). Between the first electrode layer LE and the second electrode layer UE, the entire portion of the insulating layer 50 not covered by the sealing layer 70 is included in the second section 50b.

Figure 2A:
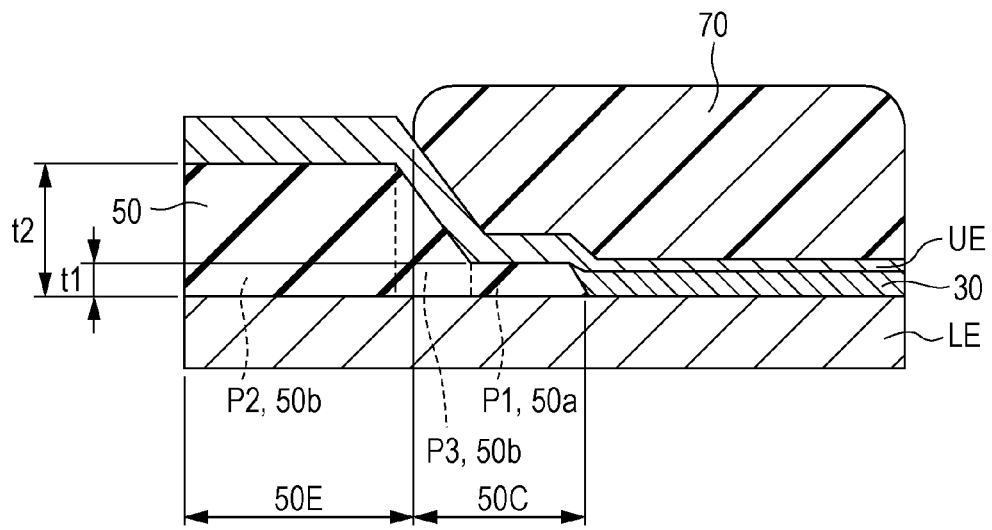
FIG. 2A is a cross-sectional diagram illustrating an example of a position of a sealing layer in the organic EL element.
Figure 2B:
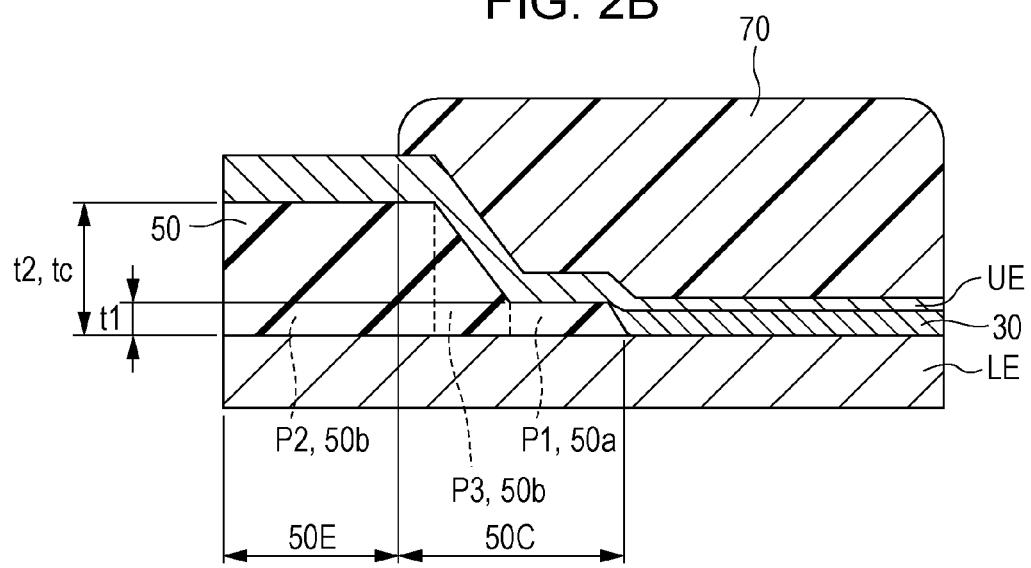
FIG. 2B is a cross-sectional diagram illustrating an example of a position of the sealing layer in the organic EL element.

The arrangement of the insulating layer 50 and the sealing layer 70 is not limited to that illustrated in FIG. 1A. For example, as illustrated in FIG. 2A, the sealing layer 70 may cover the first flat portion P1 and part of the sloping portion P3. In the illustrated arrangement, the entire exposed portion 50E of the insulating layer 50 is thicker than the covered portion 50C. Alternatively, the covered portion 50C may have a thickness equivalent to that of the exposed portion 50E in part. For example, as illustrated in FIG. 2B, the second section 50b may be exposed from under the sealing layer 70 only in part of its flat portion. In the illustrated arrangement, the covered portion 50C includes multiple portions with different thicknesses. And when the maximum thickness of the covered portion 50C is denoted by tc, the thickness of the entire exposed portion 50E is equal to or greater than the maximum thickness tc. In any case, between the first electrode layer LE and the second electrode layer UE, the entire portion of the insulating layer 50 not covered by the sealing layer 70 is included in the second section 50b.

The cross-sectional shape of the insulating layer 50 is not limited to that illustrated in FIG. 1A either. Between the first flat portion P1 and the second flat portion P2, the insulating layer 50 may have a height difference substantially perpendicular to the bottom surface of the insulating layer 50. The relatively flat portions of the insulating layer 50 are not essential. For example, the insulating layer 50 may have a shape such that it becomes gradually thicker from the organic EL layer 30 side toward the periphery of the element.

The first electrode layer LE may include a substrate 10 having an electroconductive surface 10s. The substrate 10 may be an electroconductive substrate such as a metallic foil, and may have a structure composed of an insulating support and an electroconductive film on the surface of the support.

It is also possible that the substrate 10 is the only component of the first electrode layer LE. The first electrode layer LE may have, for example, the substrate 10 and a lower electrode 20 between the electroconductive surface 10s of the substrate 10 and the organic EL layer 30. In this case, the electroconductive surface 10s of the substrate 10 is electrically coupled to the lower electrode 20 and extends out from under the sealing layer 70. The electroconductive surface 10s can thus serve as a lead-out electrode for the first electrode layer LE. If the electroconductive surface 10s of the substrate 10 is used as a lead-out electrode, the insulating layer 50 is disposed on the electroconductive surface 10s in contact with the electroconductive surface 10s.

The second electrode layer UE may have an upper electrode 40 in contact with the organic EL layer 30 and a lead-out electrode 60. The lead-out electrode 60 is electrically coupled to the upper electrode 40 and extends to be partially exposed from under the sealing layer 70. In the illustrated structure, there are multiple lead-out electrodes 60 having spaces therebetween. The upper electrode 40 and the lead-out electrode 60 may be made of different electroconductive materials. Alternatively, the upper electrode 40 and the lead-out electrode 60 may be integrated with each other, made of the same electroconductive material.

At least one of the surface of the first electrode layer LE being in contact with the insulating layer 50 (the electroconductive surface 10s of the substrate 10 in the illustrated structure) and the surface of the second electrode layer UE being in contact with the insulating layer 50 (the surface of the lead-out electrode 60 in the illustrated structure) may contain a metallic material such as silver, copper, lead, tin, or zinc.

In the organic EL element 100, the insulating layer 50 extends at least between the lead-out electrode 60 and the electroconductive surface 10s of the substrate 10. In the illustrated structure, the insulating layer 50 surrounds the lateral side of the organic EL layer 30 on the top surface of the substrate 10. The periphery of the light-emitting region including the organic EL layer 30 (four sides in the illustrated structure) can be demarcated by the insulating layer 50. It is also possible that the insulating layer 50 extends only beneath the lead-out electrode 60.

The organic EL element 100 may be, for example, a top-emission light-emitting element. In this case, it is possible to use a highly light transmissive material such as a transparent electroconductive oxide as the upper electrode 40 and a highly light transmissive inorganic or organic material as the sealing layer 70. This allows light to be taken out from the upper electrode 40 side. The organic EL element 100 may also be a bottom-emission light-emitting element, and in this case, the substrate 10 and the lower electrode 20 may be highly light transmissive materials. Furthermore, the organic EL element 100 may be a light-emitting element from which light can be picked up on both the upper electrode 40 and lower electrode 20 sides.

The organic EL element 100 according to this embodiment can be highly reliable. In particular, the organic EL element 100 offers excellent long-term reliability when at least one of the first and second electrode layers LE and UE contains a metallic material because the aforementioned poor insulation induced by ion migration is effectively prevented. The following describes the reason for this in more detail.

In the organic EL element 100, part of the multilayer structure composed of the electrode layers UE and LE and the insulating layer 50 is exposed from under the sealing layer 70. As mentioned above, ion migration should be more likely in the portions of the electrode layers UE and LE exposed to the air than in the portions covered with the sealing layer 70. In this embodiment, the exposed portion 50E, i.e., the portion of the insulating layer 50 exposed from under the sealing layer 70, is the thick second section 50b. This suppresses poor insulation caused by ion migration in the exposed portion 50E of the insulating layer 50. On the other hand, the insulating layer 50 can be thin under the sealing layer 70, where ion migration is unlikely. Improved reliability is therefore offered without a significant increase in element size from that of known elements.

The thickness of the exposed portion 50E of the insulating layer 50 is not limited and may be, for example, 100 μm or more. This effectively suppresses poor insulation caused by ion migration. The thickness of the exposed portion 50E may be, for example, 1 mm or less from a viewpoint of miniaturization.

Another advantage of the organic EL element 100 is that it can be produced more easily than known ones.

A process for producing the organic EL element 100 may involve, for example, forming the organic EL layer 30 and the electrode structure first, and then forming the sealing layer 70 to cover part of them. The sealing layer 70 may be formed through, for example, the application of a liquid material to a predetermined region and subsequent solidification of the applied material.

In this embodiment, the insulating layer 50 is thicker on the element periphery side than on the organic EL layer 30 side. A surface of the second electrode layer UE on the insulating layer 50 has a profile that reflects the difference in thickness of the insulating layer 50. Therefore, the sealing layer 70 can be easily disposed to cover part of the insulating layer 50 on the organic EL layer 30 side. In particular, when the sealing layer 70 is formed by the application of a liquid material to a predetermined region, the liquid material can be selectively applied to the thin portion (depression) of the insulating layer 50. When the organic EL element is formed by roll-to-roll process, the sealing layer 70 can be easily formed in a predetermined region. As described hereinafter, when a plurality of organic EL elements are formed on a single substrate (gang printed), the sealing layer 70 of each organic EL element which is separated from each other can be easily formed.

Any height difference on the top surface of the insulating layer 50 between the thin portion on the organic EL layer 30 side (the first flat portion P1) and the thick portion on the element periphery side (the second flat portion P2) can be used to demarcate the end of the sealing layer 70. For example, the top surface of the second electrode layer UE has a height difference reflecting the height difference on the insulating layer 50, and the end of the sealing layer 70 is located above the area of the height difference on the top surface of the second electrode layer UE. The height difference on the insulating layer 50, which is the difference between the thickness t1 of its end on the organic EL layer 30 side and the thickness t2 of its thickest portion on the element periphery side in the illustrated structure, can be, for example, 10 µm or more.

In this embodiment, in particular, the height difference section between the first flat portion P1 and the second flat portion P2 slopes to form the sloping portion P3. This sloping portion P3 prevents a break of the lead-out electrode 60 on the top surface of the insulating layer 50.

This embodiment also offers the following advantage.

A process for producing the organic EL element 100 may involve, as described hereinafter, forming the insulating layer 50 on part of the first electrode layer LE (e.g., the substrate 10) first, and then forming the organic EL layer 30 in a region on the top surface of the first electrode layer LE where the insulating layer 50 has not been formed. In this case, the organic EL layer 30 may be disposed to be in contact with the insulating layer 50 to prevent a short circuit between the electrode layers LE and UE. For more reliable prevention of the short circuit, the organic EL layer 30 may be disposed in a position where the periphery of the organic EL layer 30 is located above the end of the insulating layer 50, i.e., a position where the periphery of the organic EL layer 30 overlaps with the insulating layer 50.

In general, an organic EL layer is formed by a vacuum process, such as vacuum deposition, or a wet process, such as spin coating, slot die coating, or inkjet printing. Each of the organic films constituting the organic EL layer has a thickness of, for example, approximately nanometers. Forming such thin organic films in a manner to make their periphery overlap with an insulating layer can cause the thicknesses of the organic films to be nonuniform near the insulating layer, depending on the thickness of the insulating layer. This nonuniformity affects the uniformity of the thickness of the organic EL layer and may even lead to reduced luminescence uniformity. This problem depends on the process by which the organic EL layer is formed, and is hereinafter described in more detail for specific formation processes.

In this embodiment, however, the thickness t1 of the first flat portion P1 located on the organic EL layer 30 side of the insulating layer 50 is smaller than the thickness t2 of the exposed portion 50E, where higher insulation is required. This prevents the thickness of the organic EL layer from being nonuniform near the end of the insulating layer 50, ensuring that a more even organic EL layer is formed. This embodiment therefore can reduce the occurrence of poor insulation caused by ion migration between the first and second electrode layers LE and UE. In addition, this embodiment can suppress the uniformity of the thickness of the organic EL layer 30.

The periphery of the organic EL layer 30 may also be placed above the first section (the first flat portion P1 in the illustrated structure) of the insulating layer 50. Thus, the above-described advantage is ensured. The thickness t1 of the insulating layer 50 at its end on the organic EL layer 30 side is not limited. For example, the thickness t1 may be 1 µm or more and 10 µm or less. This allows the organic EL layer 30 to be more evenly formed on the end of the insulating layer 50. The thickness t1 of the insulating layer 50 may also be 100 µm or more. This helps to ensure that the insulation between the first and second electrode layers LE and UE remains sufficient under the sealing layer 70. The desirable range of the thickness t1 may vary according to the material of or the process of the formation of the insulating layer 50, as described in more detail hereinafter.

This embodiment, furthermore, involves less material consumption for the formation of the insulating layer than in the case where the entire insulating layer 50 has a thickness selected for the reduction of poor insulation (t2).

Individual Components of the Organic EL Element

The following describes the individual components of the organic EL element 100 in detail.

The substrate 10 can have, for example, a rectangular shape in plan view. The shape of the substrate 10 in plan view is not limited to a rectangle and can be a different shape, such as a polygon or a circle.

The substrate 10 may be a glass substrate, a plastic substrate, a metallic foil, or similar. In this embodiment, the substrate 10 has an electroconductive surface 10s. Such a substrate 10 may be an electroconductive substrate, such as a metallic foil, and may be a multilayer body composed of metallic films. Alternatively, the substrate 10 may have a structure composed of an insulating support, such as a plastic or glass substrate mentioned above, and an electroconductive film, such as a metallic film, on the surface of the support. The substrate 10 having an electroconductive surface 10s may have a degree of flexibility that allows it to be used in roll-to-roll processing. Allowing for easier formation of the sealing layer 70 in place, this embodiment is more advantageous in roll-to-roll production of organic EL elements than in other situations. It is also possible to use a metallic foil as a flexible substrate. A metallic foil can have high barrier properties against atmospheric water and oxygen. Alternatively, the substrate 10 may have a structure composed of a flexible insulating support and an electroconductive film on the surface of the support. For example, when an organic plastic film is used as a support, the substrate 10 may have a structure where a metallic film is present on the surface of the support to serve as a barrier layer for reducing the penetration of atmospheric water and oxygen because the barrier properties of organic resin against water and oxygen are poor.

In an example of an organic electroluminescence element according to this embodiment, the lower electrode 20 serves as the anode, and the upper electrode 40 as the cathode. In this case, a first carrier, i.e., the carrier injected from the lower electrode 20 into the organic EL layer 30, is holes, and a second carrier, i.e., the carrier injected from the upper electrode 40 into the light-emitting layer, is electrons.

The organic EL layer 30 may have a first-carrier injection layer, a first-carrier transport layer, the light-emitting layer, a second-carrier transport layer, and a second-carrier injection layer in this order from the lower electrode 20 side. The first-carrier injection layer, the first-carrier transport layer, the second-carrier transport layer, and the second-carrier injection layer are a hole injection layer, a hole transport layer, an electron transport layer, and an electron injection layer, respectively. When the lower electrode 20 serves as the cathode and the upper electrode 40 as the anode, the first-carrier injection layer, the first-carrier transport layer, the second-carrier transport layer, and the second-carrier injection layer, for example, are an electron injection layer, an electron transport layer, a hole transport layer, and a hole injection layer.

The organic EL layer 30 includes at least the light-emitting layer (i.e., it is possible that the light-emitting layer is the only component of the organic EL layer 30), and any layers other than the light-emitting layer, such as the first-carrier injection layer, the first-carrier transport layer, the second-carrier transport layer, and the second-carrier injection layer, are optional. The light-emitting layer can have a single-layer or multilayer structure. For example, when the intended color of the emitted light is white, the light-emitting layer may be doped with three dyes in red, green, and blue as dopants. Alternatively, the light-emitting layer may have a multilayer structure composed of a hole-transporting blue-light-emitting layer, an electron-transporting green-light-emitting layer, and an electron-transporting red-light-emitting layer. It is also possible to use a multilayer structure composed of an electron-transporting blue-light-emitting layer, an electron-transporting green-light-emitting layer, and an electron-transporting red-light-emitting layer.

The light-emitting layer may be formed through a wet process, such as coating (e.g., spin coating, spray coating, die coating, gravure printing, or screen printing). For example, the organic EL layer 30 may be formed through the formation of the insulating layer 50 on part of the top surface of the first electrode layer LE and subsequent application of a liquid material to the region surrounded by the insulating layer 50 (depression). The method of forming the light-emitting layer is not limited to coating. Examples of other methods that can be used to form the light-emitting layer include dry processes such as vacuum deposition and transfer.

Examples of materials that can be used for the electron injection layer include metal fluorides such as lithium fluoride and magnesium fluoride, metal halides such as metal chlorides typified by sodium chloride and magnesium chloride, and oxides of titanium, zinc, magnesium, calcium, barium, strontium, and so forth. When these materials are used, the electron injection layer can be formed through vacuum deposition. The electron injection layer may also be made of, for example, a mixture of an organic semiconductor material and a dopant that accelerates the injection of electrons (e.g., an alkali metal). When such a material is used, the electron injection layer can be formed through coating.

The material for the electron transport layer can be selected from the group of compounds that transport electrons. Examples of compounds of this type include metal complexes known as electron transport materials, such as Alq3, and heterocyclic compounds such as phenanthroline derivatives, pyridine derivatives, tetrazine derivatives, and oxadiazole derivatives. The material for the electron transport layer is not limited to these. Any commonly known electron transport material can be used.

The material for the hole transport layer can be a low-molecular-weight or polymeric material having a low LUMO (lowest unoccupied molecular orbital) level.

Examples of materials for the hole injection layer include organic materials such as thiophene, triphenylmethane, hydrazoline, amylamine, hydrazone, stilbene, and triphenylamine.

The cathode is an electrode for injecting electrons as a second charge (second carrier) into the organic EL layer 30. When the upper electrode 40 is the cathode, the material for the cathode may be an electrode material that is a metal, alloy, or electroconductive compound having a low work function or a mixture of them, and it is also possible to use a material having a work function of 1.9 eV or more and 5 eV or less to avoid too large a difference between the work function and the LUMO level. When the upper electrode serves as the anode, i.e., an electrode for injecting holes as a first charge (first carrier) into the organic EL layer 30, the material for the second electrode may be a metal having a high work function, and it is also possible to use a material having a work function of 4 eV or more and 6 eV or less to avoid too large a difference between the work function and the HOMO (highest occupied molecular orbital) level. The upper electrode may be an electroconductive transparent oxide, which is a highly translucent material, or an electroconductive polymer.

The lead-out electrode 60 can be formed by subjecting a material such as silver, aluminum, copper, or gold to a vacuum process such as vacuum deposition or sputtering. It is also possible to form this electrode by preparing a paste (printing ink) by mixing an organic binder and an organic solvent in a metallic powder and then printing this paste using, for example, screen printing or gravure printing. Examples of organic binders include, but are not limited to, acrylic resins, polyethylene, polypropylene, polyethylene terephthalate, polymethyl methacrylate, polystyrene, polyethersulfone, polyarylate, polycarbonate resins, polyurethane, polyacrylonitrile, polyvinyl acetal, polyamides, polyimides, diacryl phthalate resins, cellulose resins, polyvinyl chloride, polyvinylidene chloride, polyvinyl acetate, and other thermoplastic resins, as well as copolymers containing two or more of monomers constituting these resins.

Any auxiliary electrode can be made of the same material as the lead-out electrode 60, but the material for the auxiliary electrode is not limited. If the lead-out electrode 60 and the auxiliary electrode for the upper electrode 40 are made of the same material, the lead-out electrode 60 and the auxiliary electrode can be simultaneously formed. It is also possible to form the lead-out electrode 60 and the upper electrode 40 integrally from the same material.

The thickness settings for some layers in an organic electroluminescence element according to this embodiment are as follows: lower electrode 20, 10 to 200 nm; first-carrier injection layer, 10 to 200 nm; first-carrier transport layer, 10 to 100 nm; light-emitting layer, 10 to 200 nm; second-carrier injection layer, 1 to 30 nm; second electrode, 10 to 200 nm. These values are for illustrative purposes only and should not be construed as limitations.

An example of an electrode pattern for the auxiliary electrode is a grid (mesh) pattern having multiple openings. In this pattern, each opening has a square or rectangular shape in plan view.

If a square-grid auxiliary electrode is used for the upper electrode 40, its dimensional parameters can be, for example, as follows: line width L1, 1 µm to 100 µm; height H1, 50 nm to 100 µm; pitch p1, 100 µm to 2000 µm. The line width L1, height H1, and pitch p1 of the auxiliary electrode for the upper electrode 40 are not limited to any particular ranges and can be any appropriate values selected on the basis of the planar size of the element. For the efficiency of the use of the light generated in the light-emitting layer, a smaller line width L1 of the auxiliary electrode for the upper electrode 40 is more desirable. For the reduction of uneven brightness through a lowering of the resistance of the upper electrode 40, a larger line width L1 of the auxiliary electrode is more desirable. The line width L1 of the auxiliary electrode can therefore be any appropriate value selected on the basis of conditions such as the planar size of the organic electroluminescence element. The height H1 of the auxiliary electrode for the upper electrode 40 can be 100 nm or more and 10 µm or less for a lowering of the resistance of the upper electrode 40, the efficiency of the use of the material for the auxiliary electrode as formed through coating, such as screen printing (material use efficiency), the angle of radiation of the light radiated from the light-emitting layer, and so forth.

If the auxiliary electrode has a grid pattern, the shape of each opening in plan view is not limited to a square and can be, for example, a rectangle, an equilateral triangle, or an equilateral hexagon.

If the shape of each opening is an equilateral triangle, the auxiliary electrode has a triangular-grid pattern. If the shape of each opening is an equilateral hexagon, the auxiliary electrode has a hexagonal-grid pattern. The auxiliary electrode may have any pattern other than a grid pattern, such as a comb pattern or a combination of two comb electrode patterns. The auxiliary electrode may have any number of openings, i.e., multiple openings or a single opening. A single-opening configuration is possible if, for example, the auxiliary electrode has a comb pattern or a combination of two comb electrode patterns.

The sealing layer 70 can be formed through, for example, the solidification of a liquid material. Examples of materials that can be used for the sealing layer 70 in this case include thermosetting resins and light-curable resins, such as acrylic resins, polyimide resins, and silicone resins. The sealing layer 70 can be formed from these materials through printing, such as screen printing, inkjet printing, or gravure printing, spin coating and subsequent photolithographic patterning, or any similar method, although the method for forming this layer is not limited.

The sealing layer 70 can also be, for example, a glass substrate, a plastic substrate, or similar. Examples of materials that can be used for a glass substrate include soda lime glass and alkali-free glass. Examples of materials that can be used for a plastic substrate include polyethylene terephthalate, polyethylene naphthalate, polyethersulfone, and polycarbonate. Any plastic substrate needs to be used with a barrier layer that provides barrier properties against water and oxygen.

Joining such a substrate to the upper electrode using a joint material to cover the element provides the sealing layer 70. Examples of joint materials that can be used in this case include thermosetting materials and light-curable materials, such as epoxy resins and acrylic resins. These joint materials may be used in mixture with filler (e.g., silica or alumina). It is also possible to form the sealing layer 70 by placing a frame around the element and joining a substrate to this frame using a joint material. The sealing layer 70 may be a substrate having a recess that accommodates the element on the surface facing the substrate 10, with the entire periphery of the recess on this surface joined to the substrate 10.

If the substrate 10 is a translucent substrate, such as a glass substrate or a plastic substrate, and if the first electrode is also made of a translucent material, the sealing layer 70 can be made from metallic foil or similar.

Examples of materials that can be used for the insulating layer 50 include thermosetting resins and light-curable resins, such as epoxy resins, acrylic resins, polyimide resins, and silicone resins. The insulating layer 50 can be formed from these materials through printing, such as screen printing, inkjet printing, or gravure printing, spin coating and subsequent photolithographic patterning, or any similar method, although the method for forming this layer is not limited.

On the outer side of the sealing layer 70 (the side opposite the substrate 10 side), there may be a light pickup structure (not illustrated) that reduces the reflection of the light radiated from the light-emitting layer at the outer surface. An example of such a light pickup structure is an uneven structure having projections and depressions arranged in a two-dimensional periodic pattern. If the light generated in the light-emitting layer has a wavelength in the range of, for example, 300 to 800 nm, it is desirable that the period of such a two-dimensional periodic pattern be any appropriate value selected within the range of ¼ to 10 times wavelength $\lambda$, where $\lambda$ is the wavelength of the light in a medium (the wavelength in vacuum divided by the refractive index of the medium). Such an uneven structure can be formed beforehand on, for example, the outer side of the sealing layer 70 through, for example, imprinting, such as thermal imprinting (thermal nanoimprinting) or optical imprinting (optical nanoimprinting). Depending on the material for the sealing layer 70, it is also possible to form the sealing layer 70 through injection molding using an appropriate mold that produces an uneven structure directly on the sealing layer 70. The uneven structure can also be a separate component independent of the sealing layer 70, such as a prism sheet (e.g., a light diffusion film such as LIGHT-UP (registered trademark) GM3, Kimoto Co., Ltd.).

Method for Producing the Organic EL Element 100

The following describes an example of a method for producing the organic EL element 100. Production methods according to this embodiment and the materials, thickness, and other parameters of the individual components used therein are not limited to the following example.

First, a substrate 10 having an electroconductive surface 10s is prepared. The substrate 10 can be, for example, a piece of polyethylene terephthalate having an Ag film on its surface.

Then a lower electrode 20 is formed on a prospective light-emitting region on the electroconductive surface 10s of the substrate 10 using, for example, sputtering. The lower electrode 20 can be, for example, an ITO film (a thickness of, for example, 15 nm).

Then an insulating layer 50 is formed in a region of the substrate 10 other than the prospective light-emitting region. The insulating layer 50 can be obtained through, for example, the application of a polyimide resin by screen printing and subsequent patterning. The thickness t1 of the first flat portion P1 of the insulating layer 50 can be, for example, 1 µm or more and 10 µm or less, and the thickness t2 of the second flat portion P2 can be, for example, 100 μm or more and 1 mm or less. The insulating layer 50 may have a tapered end face on the organic EL layer 30 side. The sloping portion (height difference) P3 of the insulating layer 50, located between the first flat portion P1 and the second flat portion P2, slopes at an angle of, for example, 10° or more and 60° or less (the angle made by the electroconductive surface 10s and the top surface of the sloping portion P3).

Then an organic EL layer 30 (a thickness of, for example, 30 nm or more and 200 nm or less) is formed in the depression on the substrate 10, i.e., the region left unoccupied by the insulating layer 50, in a manner to be in contact with the lower electrode 20. The organic EL layer 30 can be formed through, for example, coating, such as spin coating or slot die coating, or vapor deposition. A method for forming this layer is described in more detail hereinafter. In a method based on coating, a liquid material (a solid content of 0.5 wt %) is applied to the substrate 10 to form the organic EL layer 30, with the liquid material reaching the end face of the insulating layer 50 (see FIG. 3B).

Then an upper electrode 40 is formed on the organic EL layer 30 through, for example, sputtering. The upper electrode 40 can be, for example, an ITO film (a thickness of, for example, 100 nm).

Then a lead-out electrode 60 is formed on the insulating layer 50 in a manner to be in contact with the upper electrode 40. The lead-out electrode 60 can be, for example, an Ag film (a thickness of, for example, 500 nm).

Then a sealing layer 70 is formed on the lead-out electrode 60 and the upper electrode 40. The sealing layer 70 can be formed through, for example, the dispensing application of a liquid material (e.g., an epoxy resin). In this way, an organic EL element 100 is obtained.

It is also possible to produce multiple organic EL elements on a common substrate (gang run production).

Figure 7A:
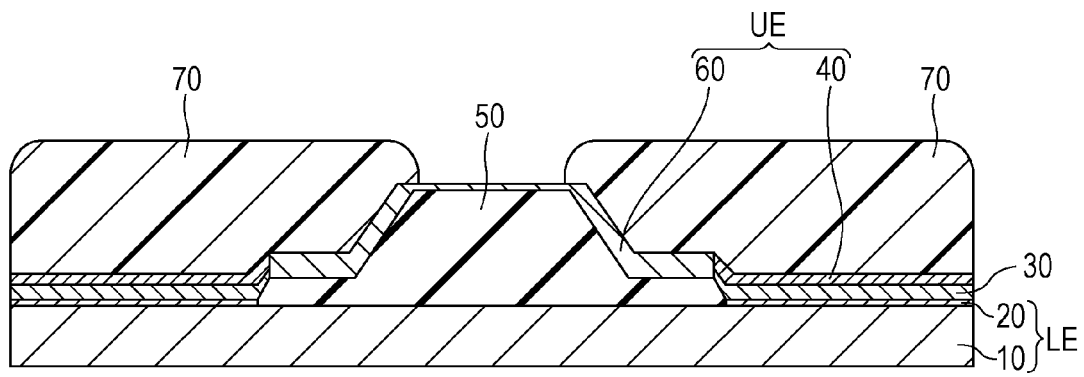
FIG. 7A is a cross-sectional view of a substrate on which multiple organic EL elements have been formed.
Figure 7B:
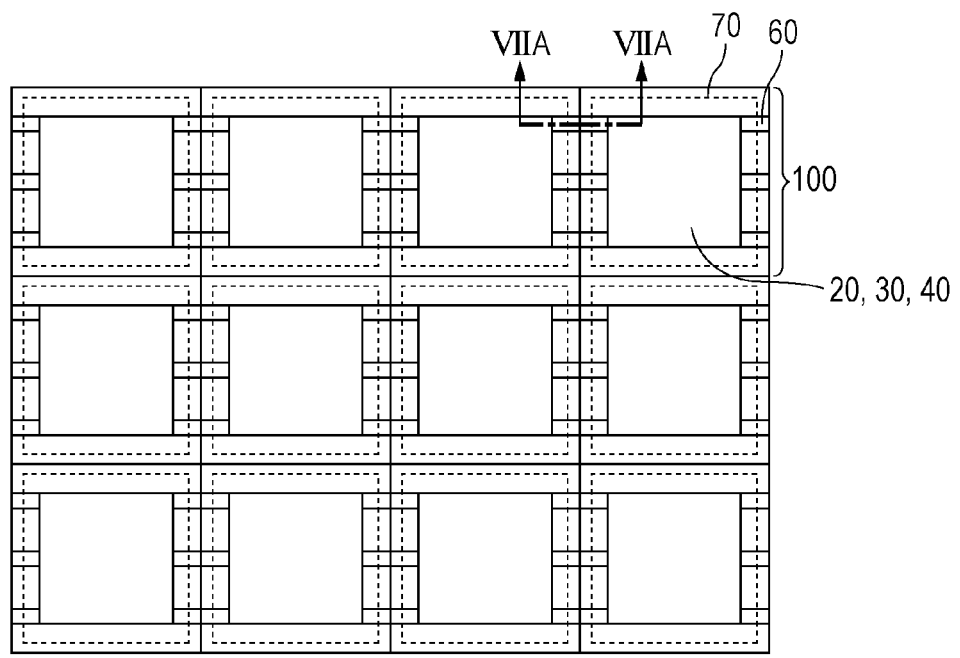
FIG. 7B is a plan view of the substrate on which multiple organic EL elements have been formed.
Figure 8:
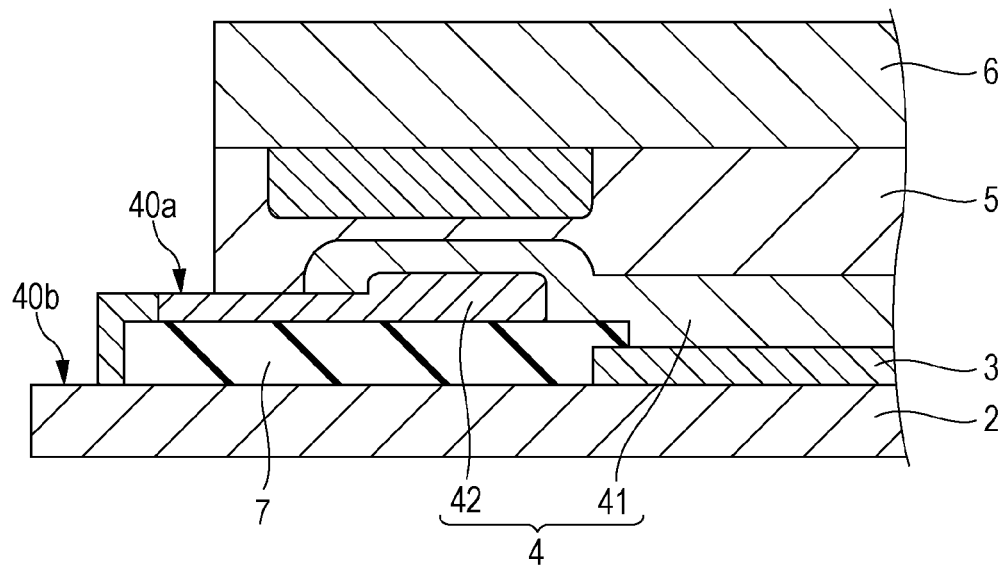
FIG. 8 is a cross-sectional view of a known organic EL device disclosed in Japanese Unexamined Patent Application Publication No. 2012-174558.

FIGS. 7A and 7B are cross-sectional and plan views, respectively, of a substrate 10 on which multiple organic EL elements 100 have been formed. FIG. 7A illustrates a cross-sectional structure along line VIIA-VIIA in FIG. 7B. Like components are referenced by like numerals in FIGS. 1A and 1B and FIGS. 7A and 7B.

A process for forming multiple organic EL elements 100 on a common substrate may involve, as mentioned above, forming the insulating layer 50 on the substrate 10 first, and then forming the organic EL layer 30, the upper electrode 40, and the sealing layer 70 through wet processes. In this case, the pattern of the insulating layer 50 can be used to form the organic EL layer 30, and the difference in the thickness of the insulating layer 50 can be used to form the sealing layer 70 in place.

An example of a method that can be used to produce multiple organic EL elements 100 simultaneously is roll-to-roll processing. The first step of this method is to feed a rolled substrate 10 to a film-forming apparatus continuously. The individual components are formed through the film-forming apparatus. For example, the organic EL layer and the sealing layer are formed through coating, and the insulating layer and the electrodes are formed using, for example, screen printing. After the formation of the individual components, the substrate is rolled up again.

The following describes in detail the relationship between the thickness of the insulating layer 50 and the uniformity of the thickness of the organic EL layer 30 for specific methods for forming the organic EL layer 30.

A case is the formation of the organic EL layer 30 through spin coating, one of coating techniques. When a hole injection layer, for example, as a component of the organic EL layer 30 is formed, the coating material is usually a solution containing 1 wt % solid. A solution of such a concentration provides a thin film with a thickness of approximately 100 nm when applied to a wet thickness, or a thickness before drying, of approximately 10 μm, for example.

Figure 3A:
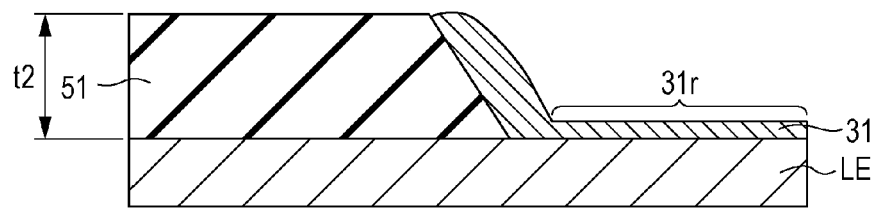
FIG. 3A is a cross-sectional diagram illustrating the shape of an organic EL layer in an organic EL element in a comparative example.

FIG. 3A illustrates a comparative example where an organic EL layer 31 is in contact with the end of a relatively thick insulating layer 51 (a thickness t2 of, for example, 100 μm) on the first electrode layer LE. As can be seen from the drawing, the large thickness t2 of the insulating layer 51 at its end on the organic EL layer 31 side, large for the thickness of the wet coating, causes the insulating layer 51 to hinder the solution from being spread by rotational centrifugal force. This causes the supply of the solution to be excessive in some areas near the end of the insulating layer 51 and insufficient in some others, resulting in a film having nonuniform thickness. In the illustrated situation, the organic EL layer 31 is thicker near the lateral side of the insulating layer 51 than in the remaining region. This may cause the even region 31r of the organic EL layer 31, i.e., the region available to provide a uniform light-emitting surface, to be smaller than the region defined by the insulating layer 51. It is therefore desired that the insulating layer be as thin as possible near the light-emitting region.

Figure 3B:
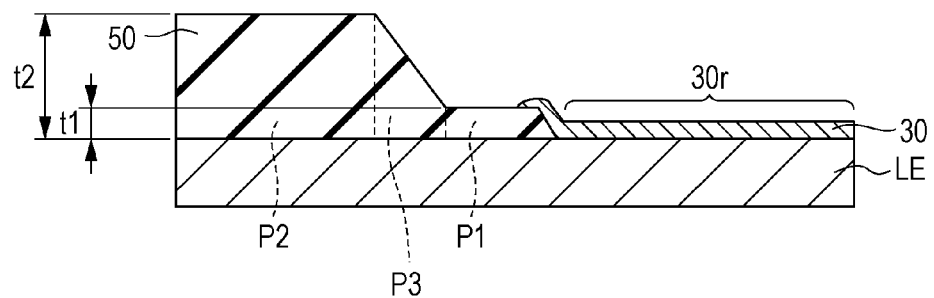
FIG. 3B is a cross-sectional diagram illustrating an example of a shape of an organic EL layer in the organic EL element.

In this embodiment, the insulating layer 50 has a smaller thickness t1 at its end on the organic EL layer 30 side than on the element periphery side. The thickness t1 may be, for example, similar to or smaller than the thickness of the wet coating (10 μm or less in the illustrated case). This ensures that, as illustrated in FIG. 3B, the thickness of the organic EL layer 30 near the insulating layer 50 is more uniform than that of the organic EL layer 31 in FIG. 3A. As a result, the even region 30r of the organic EL layer 30 is greater than the region 31r in FIG. 3A, leading to improved luminescence uniformity. This embodiment therefore reduces the occurrence of poor insulation associated with ion migration between the first and second electrode layers LE and UE with little loss of uniformity of the thickness of the organic EL layer 30.

The thickness t1 of the insulating layer 50 may be equal to or larger than the thickness with which the first and second electrode layers LE and UE are reliably isolated from each other. Such a thickness depends on the withstand voltage of the insulating material. For example, the withstand voltages of resin materials such as polyamides and epoxy resins are around 10 kV/mm as summarized in FIG. 13 of Reference 1 (volume 15 of a series of articles on methods and results of studies on the dynamic characteristics of plastic materials (in Japanese), Mitsubishi Chemical's website). An organic EL element is subjected to a voltage of, for example, approximately 10 V. When the insulating layer 50 is made of a resin material, therefore, the thickness t1 of the insulating layer 50 may be, for example, approximately 1 μm or more. Even when the insulating layer 50 is made of an inorganic material, the thickness t1 of the insulating layer 50 may be several hundreds of nanometers or more for sufficient insulation. Note that the indicated values are merely examples. The thickness t1 can be smaller if a material having a higher withstand voltage is used.

Another case is the formation of the organic EL layer 30 through another coating technique, slot die coating. The distance between the tip of the slot die and the surface of the substrate (gap) is an important parameter for the uniformity of the coating. As described in Reference 2 (Prediction of the lowest limit of coating thickness in slot die coating (in Japanese), *Nitto Denko technical report*, 2010, v. 48, 91, p.

48), too large a gap causes the surface to be left partially uncoated. Furthermore, Reference 3 (Die coating design technology for crossweb uniformity (in Japanese), *Ricoh Technical Report,* 2002, v. 28, p. 66) reports that a change in the gap between the tip of a slot die and the surface of the substrate leads to a change in the volume of the material applied, affecting the uniformity of the film thickness. For example, when a solution containing approximately 1 to 0.5 wt % hole injection material (solid content) is used, a wet coating having a thickness (wet thickness) of approximately 10 to 50 μm is needed to obtain a film with a thickness of 100 nm. According to Reference 2, when the target wet thickness is 30 μm, a gap change caused by a height difference of 5 μm or 10 μm results in a difference in wet thickness from the target of approximately 10% to 20% for a Ca of 0.25 and approximately 10% to 15% even for a Ca of 1.0. The Ca represents the proportion of the final thickness to the wet thickness. Although based on the use of model materials, the studies in these reference publications indicate that when the target wet thickness is several tens of micrometers, a change in the gap between the slot die and the substrate surface of, for example, 5 μm affects the film thickness, and a change of 10 μm further reduces the uniformity of the film thickness. It is therefore desirable that the thickness t1 of the insulating layer 50 at its end on the organic EL layer 30 side be 10 μm or less, more desirably 5 μm or less, even when slot die coating is used. This makes the formed film more even and the region with uniform luminescence larger. The lower limit of the thickness t1 of the insulating layer 50 depends, as mentioned above, on the withstand voltage of the material.

Yet another case is the formation of the organic EL layer 30 through vacuum deposition. Any obstacle present near the light-emitting region during the deposition of the organic layer produces shade when viewed from the evaporator, making the deposited film thicker in the shade than in the other area. The shade becomes greater with decreasing distance to the light-emitting region and increasing height of the obstacle. It is therefore desirable that the thickness t1 of the insulating layer 50 at its end on the organic EL layer 30 side be small, e.g., 10 μm or less. It is desirable that the thick section of the insulating layer 50 (a thickness of, for example, 100 μm or more) be away from the light-emitting region.

Variation 1 of the Organic EL Element

Figure 4A:
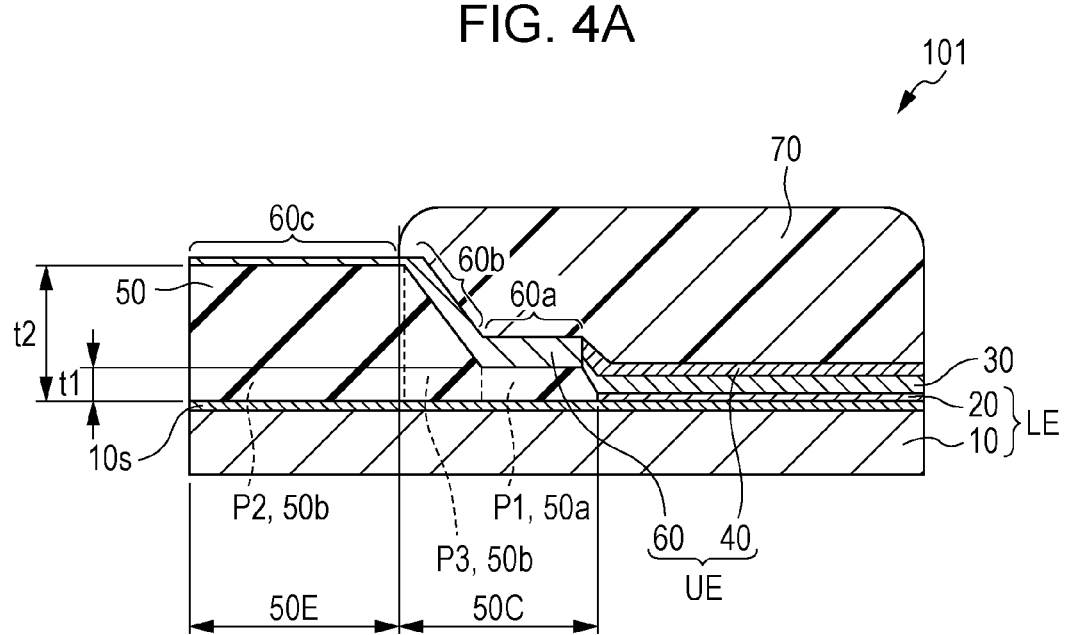
FIG. 4A is a cross-sectional view of another organic EL element according to an embodiment.
Figure 4B:
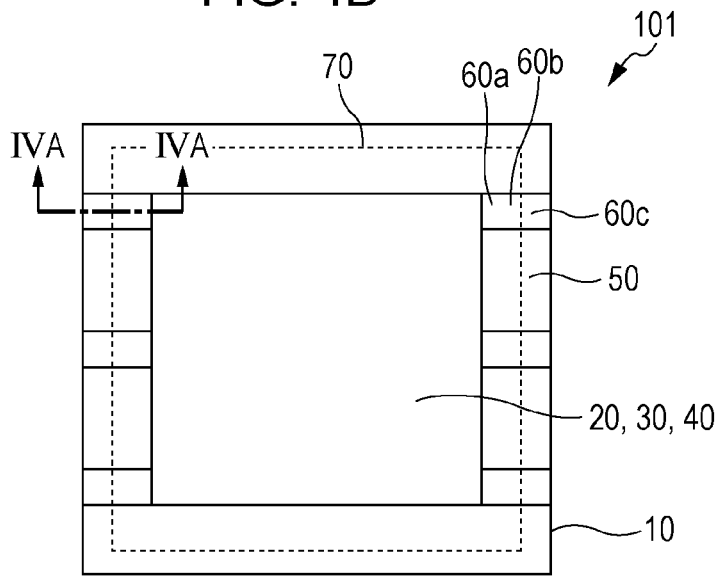
FIG. 4B is a plan view of the organic EL element according to an embodiment.

FIGS. 4A and 4B are cross-sectional and plan diagrams illustrating another organic EL element 101 according to this embodiment. FIG. 4A illustrates a cross-sectional structure along line IVA-IVA in FIG. 4B.

The organic EL element 101 is different from the organic EL element 100 in FIG. 1A in that the lead-out electrode 60 varies in thickness from part to part.

In the illustrated structure, the lead-out electrode 60 is thinner on the second flat portion P2 than on the sloping portion P3. To be more specific, the lead-out electrode 60 has a first electrode portion 60a, a sloping electrode portion 60b, and a second electrode portion 60c on the first flat portion P1, sloping portion P3, and second flat portion P2, respectively, of the insulating layer 50. The sealing layer 70 leaves the second electrode portion 60c at least partially exposed. The second electrode portion 60c is thinner than the sloping electrode portion 60b. Reducing the thickness of the portion of the lead-out electrode 60 exposed from under the sealing layer 70 in this way makes the organic EL element 101 (the portion exposed from under the sealing layer 70) thinner without changing the thickness of the sealing layer 70.

Although the sealing layer 70 in FIG. 4A leaves the entire second electrode portion 60c exposed, the second electrode portion 60c may be partially covered with the sealing layer 70. That is, the lead-out electrode 60 has a first electrode section and a second electrode section thinner than the first electrode section. The first electrode section is on the organic EL layer 30 side, and the second electrode section on the element periphery side. At least a part of the second electrode section is not covered by the sealing layer. An entire portion of the first electrode section is covered by the sealing layer. This structure maintains the aforementioned advantages. In this variation, the first electrode section is exemplified by the sloping electrode portion 60b, and the second electrode section by the second electrode portion 60c.

Variation 2 of the Organic EL Element

Figure 5A:
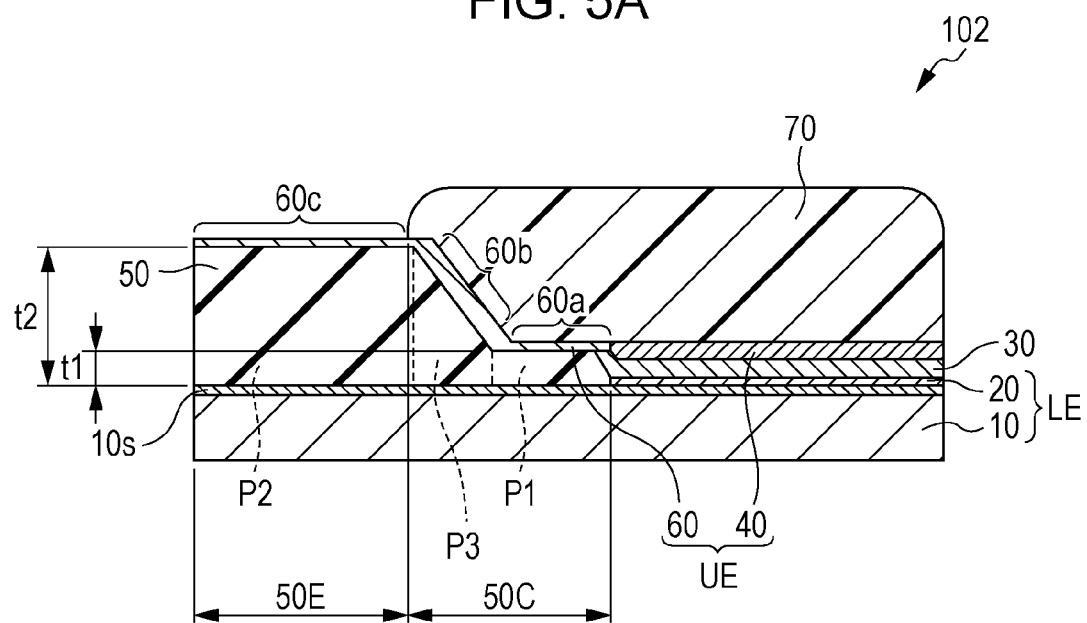
FIG. 5A is a cross-sectional view of another organic EL element according to an embodiment.
Figure 5B:
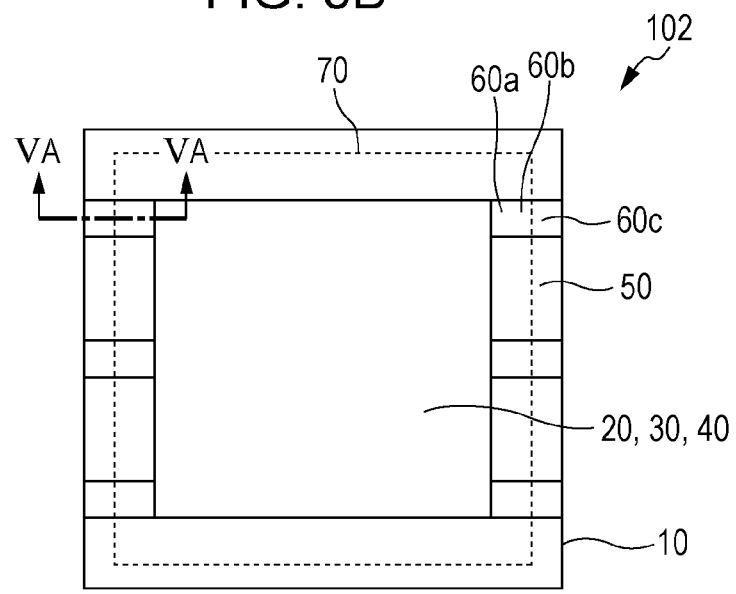
FIG. 5B is a plan view of the organic EL element according to an embodiment.

FIGS. 5A and 5B are cross-sectional and plan diagrams illustrating another organic EL element 102 according to this embodiment. The plan structure in FIG. 5B is the same as that in FIG. 4B. FIG. 5A illustrates a cross-sectional structure along line VA-VA in FIG. 5B.

The organic EL element 102 is different from the organic EL element 101 in FIG. 4A in that the lead-out electrode 60 varies in thickness from part to part under the sealing layer 70.

The portion of the lead-out electrode 60 covered with the sealing layer 70 is thinner near the organic EL layer 30 than near the end of the sealing layer 70. In the illustrated structure, the first electrode portion 60a on the first flat portion P1 of the insulating layer 50 is thinner than the sloping electrode portion 60b on the sloping portion P3.

The smaller thickness of the lead-out electrode 60 near the organic EL layer 30 than in the region more distant from the organic EL layer 30 reduces the influence of the lead-out electrode 60 on the uniformity of the thickness of the organic EL layer 30 and light pickup. Furthermore, the large thickness of the lead-out electrode 60 in the region distant from the organic EL layer 30 prevents the fracture of the lead-out electrode 60 caused by the height difference. That is, the lead-out electrode 60 has a third electrode section on the element periphery side and a forth electrode section on the organic EL layer 30 side. Also the forth electrode section adjoins the organic EL layer 30 and is thinner than the third electrode section. This structure maintains the aforementioned advantages. In this variation, a third electrode section is exemplified by the portion of the sloping electrode portion 60b covered with the sealing layer 70, and a fourth electrode section by the first electrode portion 60a.

Variation 3 of the Organic EL Element

Figure 6:
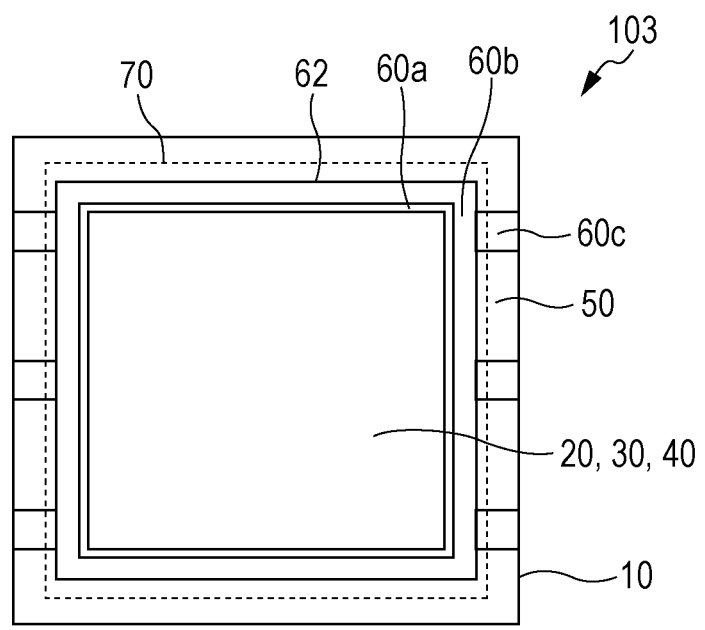
FIG. 6 is a plan view of another organic EL element according to an embodiment.

FIG. 6 is a plan diagram illustrating yet another organic EL element 103 according to this embodiment. Its cross-sectional structure is the same as that of the other organic EL elements 100 to 102. No cross-sectional view is thus presented.

The organic EL element 103 is different from the organic EL elements 100 to 102 in FIGS. 1B, 4B, and 5B in that a bus bar electrode 62 is under the sealing layer 70.

In the illustrated structure, the bus bar electrode 62 surrounds the organic EL layer 30 under the sealing layer 70 when viewed in the direction of the normal to the first electrode layer LE. The bus bar electrode 62 extends between the insulating layer 50 and the sealing layer 70. The bus bar electrode 62 and the lead-out electrode 60 may be integrated with each other, made of the same electroconductive material. It is possible to form a bus bar electrode 62 that contributes to luminescence uniformity without increasing production steps, by making the lead-out electrode 60 also serve as the bus bar electrode 62.

Furthermore, the bus bar electrode 62 placed under the sealing layer 70 reduces the occurrence of poor insulation associated with ion migration, compared with a bus bar electrode partially or completely exposed from under a sealing layer.

In conclusion, this embodiment provides a highly reliable organic EL element with reduced occurrence of poor insulation between electrodes exposed from under the sealing layer 70 associated with the migration of ions of a metallic material. This embodiment also provides an organic EL element that can be produced more easily, using the difference in the thickness of the insulating layer 50, than known ones. Furthermore, this embodiment provides an organic EL element that offers both of these advantages.

The diagrams mentioned in the above embodiment are schematic. The relative sizes and thicknesses of the individual components in these diagrams may be different from the relative dimensions of actual components.

Organic EL elements according to the present disclosure can be used in applications such as display elements for mobile phone displays, televisions, or similar and light sources. In all of these applications, they can be used as low-voltage-operating organic EL elements over a wide brightness range, from low brightness to high brightness for applications such as light sources. The high performance gives them a wide range of uses including display apparatuses, television sets, displays for mobile electronics, and illumination light sources for household, public, and business purposes.

What is claimed is:

1. An organic EL element comprising:
   a first electrode layer;
   a second electrode layer;
   an organic EL layer sandwiched between the first electrode layer and the second electrode layer, the organic EL layer including a light-emitting layer;
   an insulating layer sandwiched between the first electrode layer and the second electrode layer at least in a region where the organic EL layer is not present in a plan view; and
   a sealing layer located on the other side of the second electrode layer from the organic EL layer, the sealing layer covering, in the plan view, at least the organic EL layer, wherein:
   the insulating layer includes a first section and a second section that overlap, in the plan view, with both of the first electrode layer and the second electrode layer, the second section being thicker than the first section in a cross sectional view, the first section being closer to the organic EL layer than the second section is;
   in the plan view, at least a part of the second section is not covered by the sealing layer, an entire portion of the first section being covered by the sealing layer; and
   an entire portion of the insulating layer that overlaps with both of the first electrode layer and the second electrode layer and is not covered, in the plan view, by the sealing layer is included in the second section.

2. The organic EL element according to claim 1, wherein:
   the first section includes a first flat portion having a flat surface on the second electrode side; and
   the second section includes a second flat portion and a height difference portion, the second flat portion having a flat surface on the second electrode side, the height difference portion located between the first flat portion and the second flat portion in the plan view.

3. The organic EL element according to claim 1, wherein:
   the first electrode layer includes a substrate having an electroconductive surface; and
   the insulating layer is in contact with the electroconductive surface.

4. The organic EL element according to claim 3, wherein the first electrode layer includes a lower electrode located between the electroconductive surface and the organic EL layer.

5. The organic EL element according to claim 2, wherein the sealing layer covers, in the plan view, a part of the height difference portion and an entire portion of the first flat portion.

6. The organic EL element according to claim 1, wherein the second electrode layer includes an upper electrode and a lead-out electrode, the upper electrode being in contact with the organic EL layer, the lead-out electrode being electrically connected to the upper electrode and extending on the second section of the insulating layer.

7. The organic EL element according to claim 6, wherein:
   the lead-out electrode includes a first electrode section and a second electrode section in the plan view, the second electrode section being thinner than the first electrode section in the cross sectional view, the first electrode section located closer to the organic EL layer than the second electrode section is, and
   in the plan view, at least a part of the second electrode section is not covered by the sealing layer, an entire portion of the first electrode section being covered by the sealing layer.

8. The organic EL element according to claim 6, wherein under the sealing layer, the lead-out electrode includes a first electrode section and a second electrode section in the plan view, the second electrode section being thinner than the first electrode section in the cross sectional view, the second electrode section being located closer to the organic EL layer than the first electrode section is and being in contact with the organic EL layer.

9. The organic EL element according to claim 6, wherein the lead-out electrode includes a bus bar electrode, the bus bar electrode being covered by the sealing layer and surrounding the organic EL layer in the plan view.

10. The organic EL element according to claim 1, wherein:
    the first electrode layer includes a first surface being in contact with the insulating layer;
    the second electrode layer includes a second surface being in contact with the insulating layer; and
    at least one of the first surface and the second surface contains a metallic material.

11. The organic EL element according to claim 1, a periphery of the organic EL layer overlaps, in the plan view, with the first section of the insulating layer.

12. An organic EL element comprising:
    a first electrode layer;
    a second electrode layer;
    an organic EL layer sandwiched between the first electrode layer and the second electrode layer, the organic EL layer including a light-emitting layer;
    an insulating layer sandwiched between the first electrode layer and the second electrode layer at least in a region where the organic EL layer is not present in a plan view; and
    a sealing layer partially covering, in the plan view, the second electrode layer thereby indirectly covering the organic EL layer and a part of the insulating layer, wherein:

the insulating layer includes a first section and a second section that overlap, in the plan view, with both of the first electrode layer and the second electrode layer, the second section being thicker than the first section in a cross sectional view, the first section being closer to the organic EL layer than the second section is;

in the plan view, at least a part of the second section is not covered by the sealing layer, an entire portion of the first section being covered by the sealing layer; and an entire portion of the insulating layer that overlaps with both of the first electrode layer and the second electrode layer and is not covered, in the plan view, by the sealing layer is included in the second section.

13. The organic EL element according to claim 12, wherein:

the first section includes a first flat portion having a flat surface on the second electrode side; and the second section includes a second flat portion and a height difference portion, the second flat portion having a flat surface on the second electrode side, the height difference portion located between the first flat portion and the second flat portion in the plan view.

14. The organic EL element according to claim 12, wherein:

the first electrode layer includes a substrate having an electroconductive surface; and the insulating layer is in contact with the electroconductive surface.

15. The organic EL element according to claim 14, wherein the first electrode layer includes a lower electrode located between the electroconductive surface and the organic EL layer.

16. The organic EL element according to claim 13, wherein the sealing layer covers, in the plan view, a part of the height difference portion and an entire portion of the first flat portion.

17. The organic EL element according to claim 12, wherein the second electrode layer includes an upper electrode and a lead-out electrode, the upper electrode being in contact with the organic EL layer, the lead-out electrode being electrically connected to the upper electrode and extending on the second section of the insulating layer.

18. The organic EL element according to claim 17, wherein:

the lead-out electrode includes a first electrode section and a second electrode section in the plan view, the second electrode section being thinner than the first electrode section in the cross sectional view, the first electrode section located closer to the organic EL layer than the second electrode section is, and in the plan view, at least a part of the second electrode section is not covered by the sealing layer, an entire portion of the first electrode section being covered by the sealing layer.

19. The organic EL element according to claim 17, wherein under the sealing layer, the lead-out electrode includes a first electrode section and a second electrode section in the plan view, the second electrode section being thinner than the first electrode section in the cross sectional view, the second electrode section being located closer to the organic EL layer than the first electrode section is and being in contact with the organic EL layer.

20. The organic EL element according to claim 17, wherein the lead-out electrode includes a bus bar electrode, the bus bar electrode being covered by the sealing layer and surrounding the organic EL layer in the plan view.

* * * * *